United States Patent

Chern

[11] Patent Number: 5,963,811
[45] Date of Patent: Oct. 5, 1999

[54] METHOD OF FABRICATING A MOS DEVICE WITH A LOCALIZED PUNCHTHROUGH STOPPER

[75] Inventor: Horng-Nan Chern, Hsinchu HsienTaipei, Taiwan

[73] Assignee: Powerchip Semiconductor Corp., Hsin-Chu, Taiwan

[21] Appl. No.: 08/906,528

[22] Filed: Aug. 5, 1997

[51] Int. Cl.$^6$ .................................................. H01L 21/336
[52] U.S. Cl. .......................... 438/289; 438/307; 438/439; 438/451
[58] Field of Search .................................... 438/289, 307, 438/298, 301, 299, 439, 449, 451, 448

[56] References Cited

U.S. PATENT DOCUMENTS 5,686,321  11/1997  Ko et al. .................................. 438/289
5,893,740  6/1997  Chang et al. ............................ 438/289

Primary Examiner—Chandra Chaudhari
Assistant Examiner—Craig Thompson
Attorney, Agent, or Firm—Ladas & Parry

[57] ABSTRACT

A method of fabricating a MOS device with a localized punchthrough stopper. In the process, a dummy layer is employed to define a well for implanting the localized punchthrough stopper. The dummy layer is preferably made of silicon nitride, which has a high etching selectivity with respect to the oxide material forming sidewall spacers of MOS devices. The localized punchthrough stopper is formed at the boundary of the lightly-doped regions and the channel by implanting impurities through the well resulting from the removal of a portion of the dummy layer adjacent to the gate structure.

20 Claims, 3 Drawing Sheets

METHOD OF FABRICATING A MOS DEVICE WITH A LOCALIZED PUNCHTHROUGH STOPPER

BACKGROUND OF THE INVENTION

1. Field of the Invention

The present invention relates in general to a Metal-Oxide-Semiconductor (MOS) device, more particularly, to a MOS device having a localized punchthrough stopper adjacent to lightly-doped regions therein, which prevents punchthrough caused by the reduced channel length.

2. Description of the Prior Art

Punchthrough is a breakdown phenomenon caused by the widening of the drain depletion region when the reverse-bias voltage on the drain is increased. The electric field of the reverse-biased drain may penetrate into the source region and thereby reduce the energy barrier of the source-to-drain junction. Therefore, the shorter the channel length of the MOS device, the more likely the punchthrough phenomenon is to occur. It is evident that punchthrough is a severe problem in modern submicron devices.

At the present, there are at least three popular techniques for preventing punchthrough degradation in submicron MOS devices, which techniques are described below. A first approach for preventing the punchthrough phenomenon is to implant a punchthrough stopper accompanied by a conventional lightly-doped drain (LDD) implantation region. However, such an implantation may increase the concentration of the substrate near the source and drain junctions and thereby increase the junction capacitance. In addition, the impurities doped by the punchthrough stopper implantation may diffuse into the channel region, increasing the threshold voltage of this device.

A second approach is to utilize a large-angle-tilt implantation to form a punchthrough stopper near the boundary between the lightly-doped region and the device channel. Anti-punchthrough effect of this implantation is controlled by the doping energy and tilt angle. Those skilled in the art appreciate that it is difficult to control these factors precisely to achieve the intended effect. In addition, this anti-punchthrough implantation is implemented by variable doping angles, which may cause the impurity concentration in the source and drain regions to fluctuate undesirably.

A third popular approach is to use a technology called steep retrograde channel doping, which involves modifying the potential barrier from the source region to the drain region to decrease the possibility of punchthrough. However, it has been reported that this anti-punchthrough process may increase the body effect of this device, resulting in an increase in the threshold voltage.

Theoretically, an ideal punchthrough stopper should be located near the lightly-doped regions of MOS devices. Its impurities should be confined to a localized region and should not diffuse into other neighboring zones, such as the device channel. As can be seen, conventional anti-punchthrough techniques do not provide ideal punchthrough stoppers, especially in submicron MOS devices where the geometries are very small.

SUMMARY OF THE INVENTION

In general terms, it is an object of the present invention to provide a better method of fabricating a punchthrough stopper in a MOS device. The present invention provides a method of fabricating a MOS device having a localized punchthrough stopper near a lightly-doped region, which punchthrough stopper suffers less punchthrough degradation than stoppers known in the prior art by inhibiting the implanted impurities from intruding into the channel region.

The present invention achieves the above-indicated objectives by providing a method of fabricating a MOS device with a localized punchthrough stopper on a substrate, such as a silicon wafer. Field oxide regions are formed on the substrate preferably using conventional techniques. Thereafter, a gate oxide layer, a polysilicon layer and a dielectric layer preferably made of silicon oxide, are successively formed on the substrate. This overlaying oxide layer can increase the total height of gate structures (each including a gate oxide and a conductive gate polysilicon) and serves as an etching sacrifice layer during the following etching process. Next, the overlaying oxide layer, the polysilicon layer and the gate oxide are patterned to form a composite structure. Meanwhile, the polysilicon lines are formed on the field oxide regions in the same patterning step. Lightly-doped regions of the MOS device are then formed at both sides of the gate structure.

To reserve the space for implanting the punchthrough stopper, a thin dielectric layer, preferably made of silicon nitride, is formed on the top and the sides of the composite structure. This thin nitride layer is then covered with a thick BPSG dielectric layer for smoothing the topology of the substrate and the layers formed thereon. Therefore, after etching back the thick dielectric layer to remove the portion over the composite structure and expose the underlying thin nitride layer, a residue of the thick dielectric layer remains adjacent the composite structure on the active regions.

Next, the exposed portion of the thin nitride layer located on the top and the sides of the composite structure is removed. At this time, between the composite structure and the residue of the thick oxide layer there occurs a dielectric-free space or well above the lightly-doped regions of this device. After doping the substrate adjacent to the composite structure through the space or well resulting from the removal of the thin nitride layer, a punchthrough stopper is formed near the boundary of the lightly-doped region and the device channel.

The space resulting from the removal of the thin nitride layer is refilled with oxide material and then these oxide layers are anisotropically etched, so that conventional sidewall spacers are formed at both sides of the gate structure. Heavily-doped regions of this device are then doped, using the sidewall spacers as an implant mask. The MOS device with a punchthrough stopper is then completed.

BRIEF DESCRIPTION OF THE DRAWINGS

The following detailed description, given by way of example and not intended to limit the invention solely to the embodiments described herein, will best be understood in conjunction with the accompanying drawings, in which.

DETAILED DESCRIPTION OF THE PREFERRED EMBODIMENTS

In the present invention, a dummy layer made of silicon nitride is used in the process of fabricating a punchthrough stopper in a MOS device. This dummy layer is formed such that it is in contact with the gate structure of the MOS device, especially at the sides of the gate structure. After removing this dummy layer, a space located vertical to the lightly-doped regions of the MOS device is formed. Such a space may be used in the process of the anti-punchthrough implantation to restrict the implant direction. Therefore, the punchthrough stopper is localized around the neighborhood of the lightly-doped regions.

Figure 1:
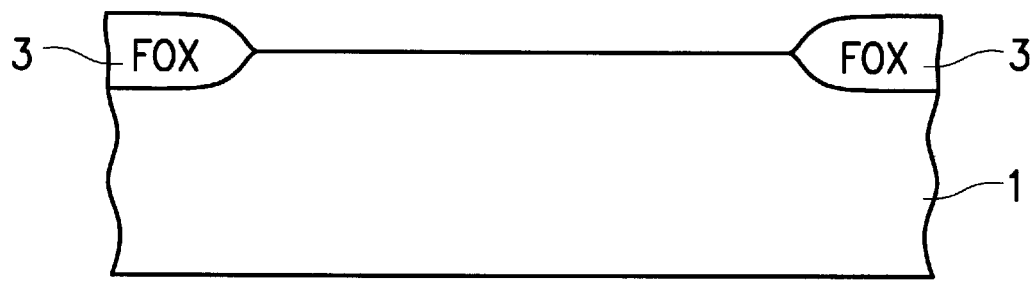
FIG. 1 to FIG. 8 schematically illustrate the detailed process of fabricating a MOS device with a punchthrough stopper in accordance with the embodiment of the present invention, sequentially showing the cross-sectional views during the process.

Referring to FIGS. 1 to 8, a method of fabricating a MOS device having a localized punchthrough stopper on substrate 1 is disclosed. In FIG. 1, field oxide regions 3 are formed on substrate 1 by, for example, the conventional LOCOS process to isolate active regions on substrate 1. In this embodiment described below, an NMOS device is formed on substrate 1 which is lightly doped with P-type impurities, such as boron. However, those skilled in the art will understand that PMOS devices can be fabricated in a similar manner by substituting N-type impurities for the P-type impurities.

Having the field oxide formation in place, the manufacturing process according to the preferred embodiment of the invention is described in detail below.

Figure 2:
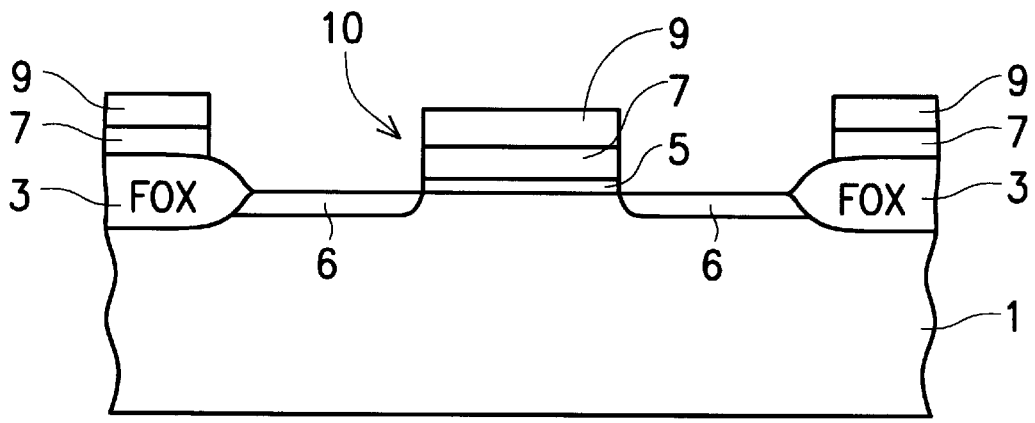

Referring to now FIG. 2, a gate oxide layer 5, a conductive polysilicon layer 7 and a dielectric layer 9 are sequentially deposited and lithographically patterned on substrate 1. Gate oxide 5 is a very thin oxide layer, preferably about 20–150 Å in thickness, without contamination and usually is grown with care by a dry oxidation process. Conductive polysilicon 16 has a thickness of about between 0.4 ρm–0.5 μm and usually is grown by CVD (chemical-vapor deposition), but alternatively other deposition techniques may be used. In FIG. 2, the polysilicon 7 on the field oxide regions 3 serves as a conducting line. In addition, polysilicon 7 and the underlying gate oxide 5 serve as a gate structure of the MOS device being fabricated.

Due to the fact that the field oxide regions 3 are considerably thicker than the gate oxide layer 5, the height of polysilicon 5 on field oxide regions 3 and on the gate oxide layer 5 of the MOS device are different. In addition, the height of polysilicon layer 7 is not sufficient for the following steps. Therefore, in this embodiment, a dielectric layer 9 is deposited on polysilicon layer 7 to increase the total height of the structure being formed. In addition, dielectric layer 9 also serves as an etching sacrifice layer during the following etching process, which will be described later. Dielectric layer 9 is preferably made of silicon oxide and preferably has a thickness between about 2000 Å and 4000 Å. After depositing these layers, they are patterned using conventional photolithography techniques. For convenience, the term of "composite structure 10" is used to refer to the composite structure of gate oxide 5, polysilicon 7 and dielectric layer 9 in the following description. At this time, n-type lightly-doped regions 6 are formed in substrate 1 on both sides of composite structure 10 preferably using conventional LDD process technology for this step.

Figure 3:
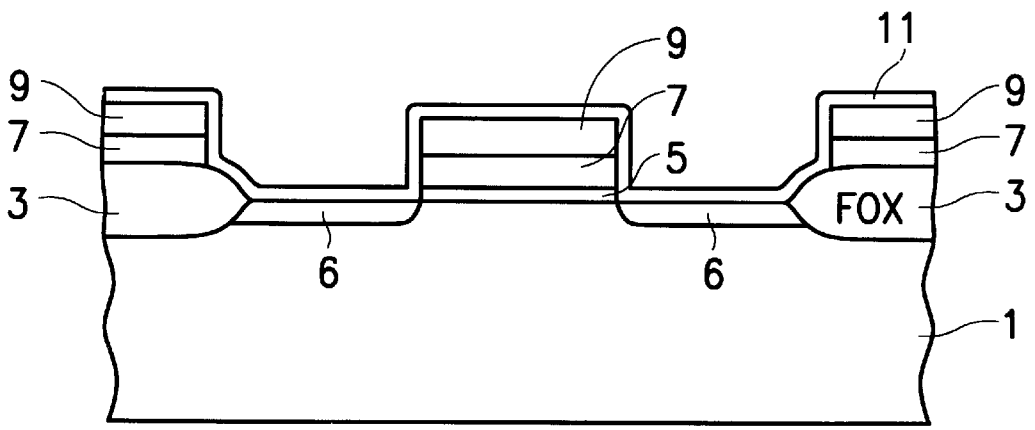

Turning now to FIG. 3, a dummy layer 11 is deposited on dielectric 9 and the exposed silicon substrate 1 by CVD or other conventional deposition technologies. In this embodiment, dummy layer 11 is preferably made of silicon nitride and preferably has a thickness between 200 Å and 500 Å. As is described above, dummy layer 11 is used to define vertical wells at the edges of the lightly-doped regions adjacent the gate as an aid in the implantation of the punchthrough stopper. Therefore, the thickness of dummy layer 11 is a factor in the formation of the punchthough stopper.

Figure 4:
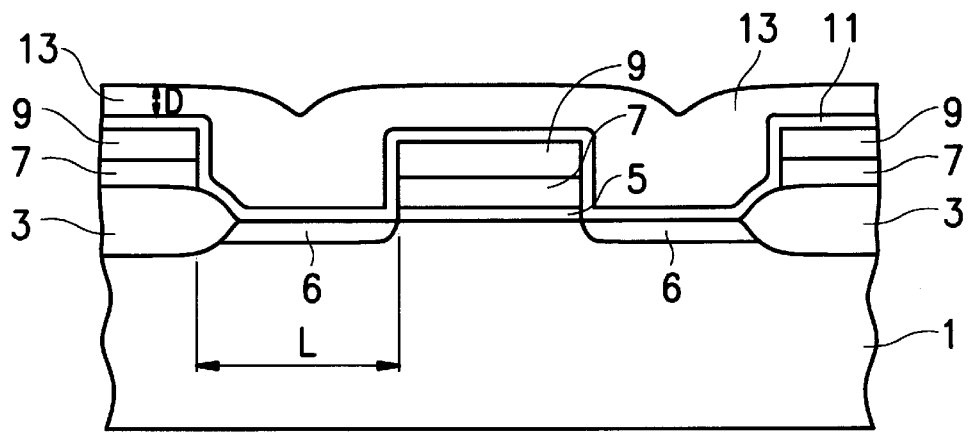

As can be seen with reference to FIG. 4, a thick dielectric layer 13 is then deposited on dummy layer 11. The thick dielectric layer 13 is preferably made of oxide material and preferably has a thickness of about 5000 Å in this embodiment. The purpose of the thick dielectric layer 13 is to serve as a mask layer for removing a portion of the dummy layer 11 at the top and the sides of the composite structure 10. As such, the thick dielectric layer 13 is etched back, as can be seen with reference to FIG. 5. Therefore, the thickness D (see FIG. 4) of the dielectric layer 13 should be large enough for a portion of the dielectric layer 13 to remain on over the lightly-doped regions 6 after etching back. It is preferable that the thickness D of the dielectric layer 13 be greater than half the distance L (see FIG. 4) between the composite structure 10 and the polysilicon lines 7 over the field oxide regions. That makes the topology smooth due to the dielectric accumulation effect between the composite structure 10 and the polysilicon lines.

The thick dielectric layer 13 may alternatively be made of borophosphosilicate glass (BPSG), which can flow at a lower temperature, for example, 800° C.–850° C. If BPSG is used, then an additional reflow step may be utilized to smooth the topology of the whole structure. Those skilled in the art will appreciate that other dielectric materials, such as phosphosilicate glass (PSG), may alternatively be used.

Figure 5:
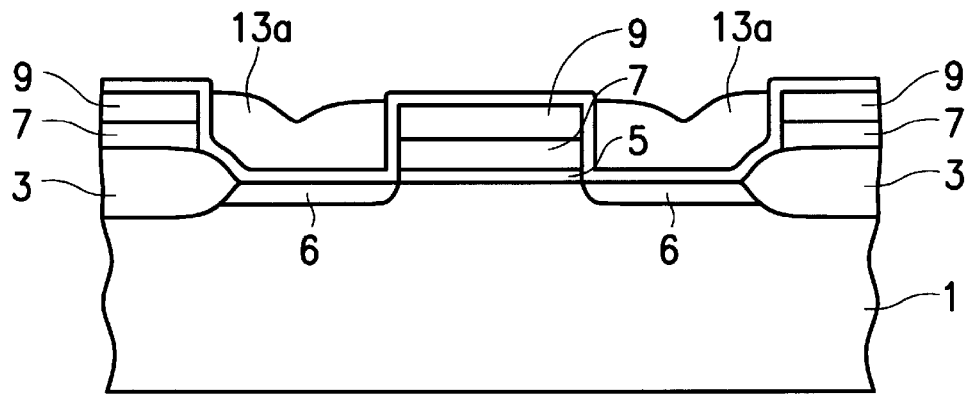

The dielectric layer 13 is etched back preferably by a conventional etching process, leaving regions of dielectric residue 13a, as shown in FIG. 5. The regions of dielectric residue 13a remain on the lightly-doped regions 6 of substrate 1. At this time, that the portion of the thin dielectric layer 11 on the top of the composite structure 10 is exposed.

Figure 6:
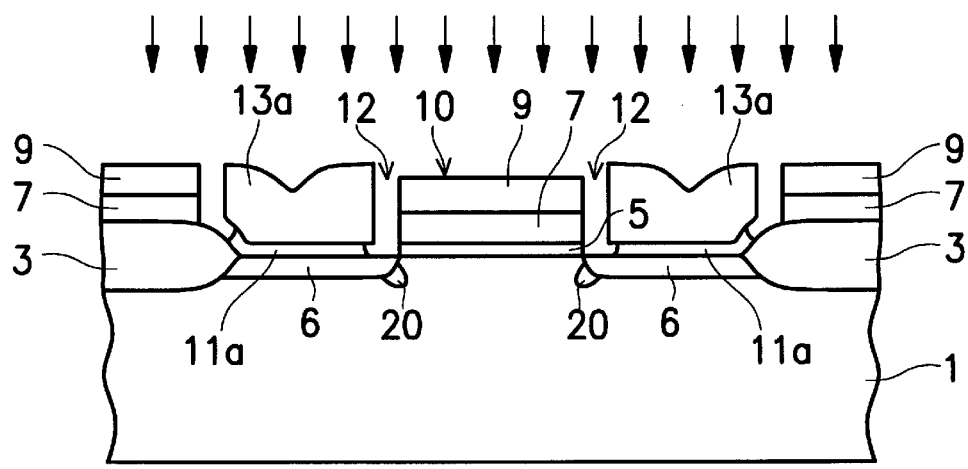

Next, as shown in FIG. 6, the dummy layer 11 is isotropically etched to remove a portion of the dummy layer 11 on the top and the sides of the composite structure 10. In the step of etching the dummy layer, the regions of residue 13a serve as an etching mask and dielectric 9 serves as an etching stopper. Since dielectric 9 and the dielectric residue 13a are made of oxide and thin dielectric layer 11 is made of nitride, the etchant used in this etching step must have a high selectivity with respect to oxide material. For example, hot phosphoric acid (about 160° C.) can be used as an etchant by wet etching. After partially removing the dummy layer 11, a nitride residue 11a remains below the oxide residue 13a, as shown in FIG. 6. The removed dummy layer adjacent the gate region define implantation wells 12.

Again referring to FIG. 6, punchthrough stoppers 20 can be formed by implanting p-type impurities, such as boron, through wells 12. In this embodiment, the doping energy is preferably between 30 k–50 k and the dosage is preferably between 3E12 atoms/cm2 and 5E13 atoms/cm2. Those skilled in the art will understand that phosphorus (P) and arsenic (As) can be used in manufacturing PMOS devices. As shown in FIG. 6, the punchthrough stopper 20 is located near the boundary of the lightly-doped regions 6 and the gate area (i.e., the device channel). Such punchthrough stoppers are more ideal than prior art anti-punchthrough structures. Those skilled in the art will appreciate that the presence of the field oxide masks implantation of the silicon where the nitride has been removed from the remote sides of residue regions 13a.

Up to this step, the desired punchthrough stoppers have been formed at the boundary of the lightly-doped regions and the device channel. Important steps in the fabrication of a punchthrough stopper in accordance with the aforedescribed preferred embodiment of the invention are summarized as follows:

(a) forming a first dielectric layer (9) of oxide on a gate structure of the MOS device;

(b) covering a composite structure (10), which includes the gate structure and a portion of the first dielectric layer (9), with a second dielectric layer (11) of nitride;

(c) depositing a third dielectric layer (13) of oxide on the second dielectric layer (11);

(d) etching back the third dielectric layer (13) to expose the second dielectric layer (11) over the composite structure (10);

(e) isotropically etching the second dielectric layer (11), thereby removing that portion of the second dielectric layer (11) on the top and the sides of the composite structure (10) and thereby defining implantation wells (12) adjacent the composite structure (10); and (f) doping the substrate adjacent to the composite structure through the wells (12) on the sides of the composite structure (10), to form thereby punchthrough stoppers (20).

Figure 7:
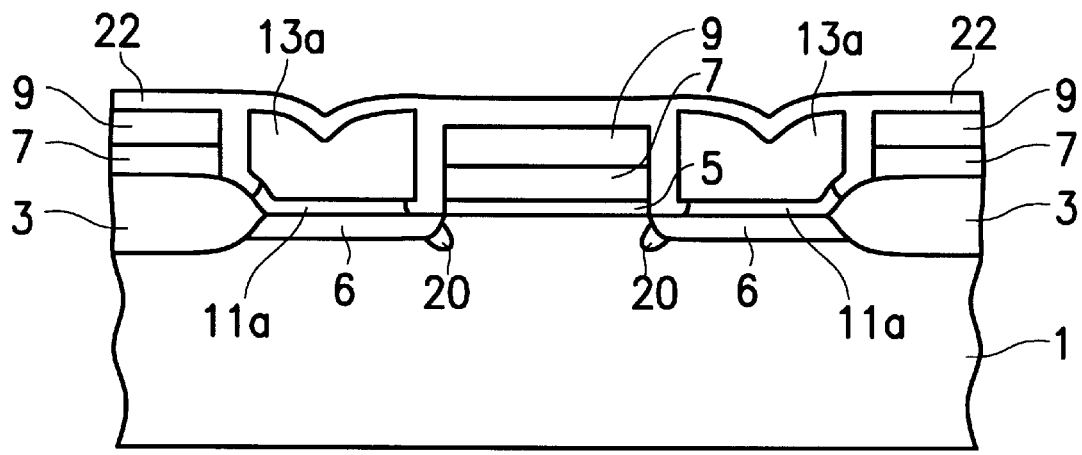
Figure 8:
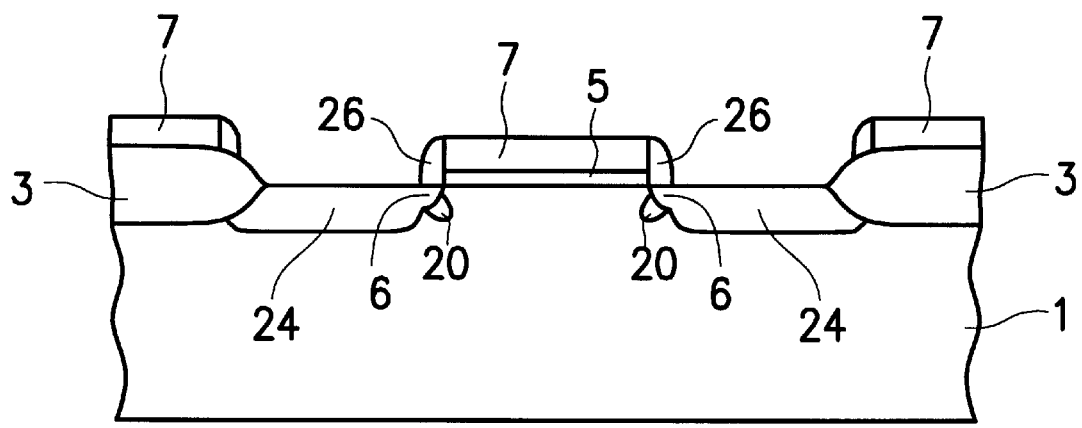

The following steps are then preferably used to complete the fabrication of the MOS device. As is shown in FIG. 7, an oxide layer 22 is formed to refill the spaces (including wells 12) resulting from the removal of the dummy layer 11. Accordingly, dielectric 9, dielectric residue 13a and oxide layer 22 are made of oxide material. Next, these oxide layers are anisotropically etched to form sidewall spacers 26 adjacent to the gate structure of the MOS device. After removing the remaining residue 11a of the dummy layer and forming heavily-doped regions 24 in the exposed substrate 1, a MOS device with a punchthrough stopper is completed.

The foregoing description of a preferred embodiment of the present invention has been provided for the purposes of illustration and description. It is not intended to be exhaustive or to limit the invention to the precise embodiment disclosed. Many modifications and variations will now become apparent to practitioners skilled in the art. The embodiments were chosen and described to best explain the principles of the invention and its practical application, thereby enabling others skilled in the art to understand the invention, to practice various other embodiments and to make various modifications suited to the particular use contemplated. It is intended that the scope of the invention be defined by the following claims and their equivalents.

What is claimed is:

1. A method of fabricating a MOS device with a localized punchthrough stopper on a substrate, comprising:

forming a composite structure including a gate oxide layer and a conductive polysilicon layer on the substrate;

depositing a first dielectric layer on the top and the sides of the composite structure and the exposed substrate;

depositing a second dielectric layer on the first dielectric layer;

etching back the second dielectric layer to expose the first dielectric layer over the composite structure;

isotropically etching the first dielectric layer to remove a portion of the first dielectric layer on the top and the sides of the composite structure, thereby defining at least one well on at least one side of the composite structure;

doping the exposed substrate adjacent to the composite structure through said at least one well to form a punchthrough stopper;

refilling said at least one well on the sides of the composite structure with a third dielectric layer;

anisotropically etching the second dielectric layer and the third dielectric layer to form sidewall spacers;

removing exposed portions of the first dielectric layer; and forming doped regions in the exposed substrate.

2. The method of claim 1 wherein the first dielectric layer is made of silicon nitride.

3. The method of claim 1 wherein the second dielectric layer is made of borophosphosilicate glass (BPSG).

4. The method of claim 3, wherein after the step of depositing the second dielectric layer further includes a step of reflowing the second dielectric layer to smooth the surface of the second dielectric layer.

5. The method of claim 1, wherein the third dielectric layer is made of oxide.

6. The method of claim 1 wherein the thickness of the first dielectric is between 200 Å and 500 Å.

7. The method of claim 1 wherein the composite structure further includes a fourth dielectric layer overlaying the conductive polysilicon layer.

8. The method of claim 7 wherein the fourth dielectric layer is made of oxide.

9. The method of claim 7 wherein the thickness of the fourth dielectric is between 2000 Å and 4000 Å.

10. The method of claim 1 wherein in the step of forming the punchthrough stopper doping impurities with a dosage of between 3E12 atoms/cm2 and 5E13 atoms/cm2.

11. A method of forming a punchthrough stopper in the structure of a MOS device on a substrate, comprising the steps of:

forming a composite structure including a gate oxide layer and a conductive polysilicon layer on the substrate;

covering the composite structure with a first dielectric layer;

depositing a second dielectric layer on the first dielectric layer, wherein a portion of the second dielectric layer over the composite structure is thinner than a portion of the second layer directly over the substrate;

removing the portion of the second dielectric layer over the composite structure using the first dielectric layer as an etching stop layer;

isotropically etching the first dielectric layer to remove a portion of the first dielectric layer on the top and the sides of the composite structure, thereby defining at least one well on at least one side of the composite structure; and doping the exposed substrate adjacent to the composite structure through said at least one well to form a punchthrough stopper.

12. The method of claim 11 wherein the first dielectric layer is made of silicon nitride.

13. The method of claim 11 wherein the second dielectric layer is made of borophosphosilicate glass (BPSG).

14. The method of claim 13, wherein after the step of depositing the second dielectric layer further includes a step of reflowing the second dielectric layer to smooth the surface of the second dielectric layer.

15. The method of claim 11 wherein the thickness of the first dielectric is between 200 Å and 500 Å.

16. The method of claim 11 wherein the composite structure further includes a third dielectric layer overlaying the conductive polysilicon layer.

17. The method of claim 16 wherein the third dielectric layer is made of oxide.

18. The method of claim 16 wherein the thickness of the third dielectric is between 2000 Å and 4000 Å.

19. The method of claim 11 wherein in the step of forming the punchthrough stopper doping impurities with a dosage of between 3E12 atoms/cm2 and 5E13 atoms/cm2.

20. A method of fabricating a MOS device with a localized punchthrough stopper on a substrate, comprising:

forming a composite structure including a gate oxide layer and a polysilicon layer on the substrate;

depositing a first dielectric layer on the top and the sides of the composite structure and the exposed substrate;

depositing a second dielectric layer on the first dielectric layer;

removing a portion of the second dielectric layer;

isotropically etching the first dielectric layer to remove a portion of the first dielectric layer on the top and the sides of the composite structure, thereby defining at least one well on at least one side of the composite structure;

doping the exposed substrate adjacent to the composite structure through said at least one well to form a punchthrough stopper.

* * * * *